US012782833B2

(12) United States Patent
Buczek et al.

(10) Patent No.: US 12,782,833 B2
(45) Date of Patent: Nov. 3, 2026

(54) PASSIVE DUST TRAP, ILLUMINATION SYSTEM, AND LITHOGRAPHY SYSTEM

(71) Applicant: Cymer, LLC, San Diego, CA (US)

(72) Inventors: Sean Marcus Buczek, San Diego, CA (US); Edward Siqi Luo, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 148 days.

(21) Appl. No.: 18/867,151

(22) PCT Filed: Mar. 28, 2023

(86) PCT No.: PCT/US2023/016613

§ 371 (c)(1),
(2) Date: Nov. 19, 2024

(87) PCT Pub. No.: WO2023/234999

PCT Pub. Date: Dec. 7, 2023

(65) Prior Publication Data

US 2025/0216803 A1 Jul. 3, 2025

Related U.S. Application Data

(60) Provisional application No. 63/490,552, filed on Mar. 16, 2023, provisional application No. 63/348,418, filed on Jun. 2, 2022.

(51) Int. Cl.
*G03F 7/00* (2006.01)

(52) U.S. Cl.
CPC ...... *G03F 7/70916* (2013.01); *G03F 7/70025* (2013.01); *G03F 7/70925* (2013.01)

(58) Field of Classification Search
CPC ............ G03F 7/70025; G03F 7/70916; G03F 7/70925; B01D 45/06; H01S 3/03;
(Continued)

(56) References Cited

U.S. PATENT DOCUMENTS

| | | | | |
|---|---|---|---|---|
| 3,807,148 | A | 4/1974 | Fike et al. | |
| 6,570,899 | B1 * | 5/2003 | Yabu | H01S 3/225 372/50.1 |

(Continued)

FOREIGN PATENT DOCUMENTS

| | | | |
|---|---|---|---|
| CN | 110945433 | A | 3/2020 |
| EP | 2213357 | A1 | 8/2010 |

(Continued)

OTHER PUBLICATIONS

European International Searching Authority, International Search Report and Written Opinion, counterpart PCT Application No. PCT/US2023/016613, mailed Jun. 29, 2023, 12 pages total.

*Primary Examiner* — Deoram Persaud
(74) *Attorney, Agent, or Firm* — DiBerardino McGovern IP Group LLC

(57) ABSTRACT

A system includes first and second sections. The first section includes an elongated plate including a squared edge, a tapered edge, a first surface, a second surface, and first and second extensions extending from the second surface. The second section includes first and second chambers with a dividing wall between the first and second chambers, the first chamber including a planar surface and the second chamber including a sloped surface disposed opposite the tapered edge. The system includes first and second end plates to secure the first section above the second section such that the dividing wall is interposed between the first and second extensions.

20 Claims, 11 Drawing Sheets

(58) Field of Classification Search
CPC ........ H01S 3/036; H01S 3/0971; H01S 3/104; H01S 3/225
See application file for complete search history.

(56) References Cited

U.S. PATENT DOCUMENTS

| | | | | |
|---|---|---|---|---|
| 7,511,799 | B2 | 3/2009 | Tel et al. | |
| 11,175,596 | B2 | 11/2021 | Nienhuys et al. | |
| 12,103,080 | B2 * | 10/2024 | Naruse | B01D 46/10 |
| 2005/0226301 | A1 | 10/2005 | Partlo et al. | |
| 2009/0166286 | A1 * | 7/2009 | Volchko | G01L 19/0654 210/455 |
| 2013/0010270 | A1 * | 1/2013 | Van Boxtel | G03F 7/70716 355/30 |
| 2014/0020558 | A1 * | 1/2014 | Gururaja Rao | B03C 3/011 96/57 |
| 2020/0225591 | A1 * | 7/2020 | Nienhuys | B01D 45/08 |
| 2020/0332689 | A1 * | 10/2020 | Niemann | B01D 39/10 |
| 2023/0008480 | A1 | 1/2023 | Niemann et al. | |
| 2023/0347267 | A1 * | 11/2023 | Jones | B01D 33/06 |

FOREIGN PATENT DOCUMENTS

| | | | |
|---|---|---|---|
| JP | H03146108 | A | 6/1991 |
| TW | 202139547 | A | 10/2021 |

* cited by examiner

PASSIVE DUST TRAP, ILLUMINATION SYSTEM, AND LITHOGRAPHY SYSTEM

CROSS-REFERENCE TO RELATED APPLICATIONS

This application is the U.S. National Stage Application of International Patent Application No. PCT/US2023/016613, filed on Mar. 28, 2023, which claims priority to U.S. Application No. 63/348,418, filed Jun. 2, 2022, titled PASSIVE DUST TRAP, ILLUMINATION SYSTEM, AND LITHOGRAPHY SYSTEM; and U.S. Application No. 63/490,552, filed Mar. 16, 2023, titled PASSIVE DUST TRAP, ILLUMINATION SYSTEM, AND LITHOGRAPHY SYSTEM. Each of these applications is incorporated herein in its entirety by reference.

FIELD

The present disclosure relates to contamination filters, for example, dust collectors for illumination sources in lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which may be a mask or a reticle, can be used to generate a circuit pattern an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (photoresist or simply "resist") provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

A lithographic apparatus typically includes an illumination system that conditions radiation generated by a radiation source before the radiation is incident upon a patterning device. A pulsed-discharge laser is one example of an illumination source used for DUV lithography. The pulsed-discharge laser may use a gas medium that, when a voltage pulse is applied to the gas medium, the gas ionizes and releases DUV radiation. Each pulse may generate a contaminant (e.g., dust particles) as a result of the gas medium interacting with the voltage-supplying electrodes. There is a risk that the contaminant may then be in the path of the DUV radiation, resulting in an unpredictable fluctuation of DUV intensity.

SUMMARY

Accordingly, dust collection systems described herein may be used for providing illumination stability and light-source longevity.

In some embodiments, a system comprises a first section comprising an elongated plate having a squared edge, an opposed tapered edge, a first surface, an opposed second surface, and first and second extensions extending from the opposed second surface. The system further comprises a second section comprising first and second chambers with a dividing wall between the first and second chambers. The first chamber comprises a planar surface on an exterior surface of the first chamber and is disposed facing the opposed second surface. The second chamber comprises a sloped surface on an exterior side of the second chamber and is disposed facing the tapered edge. The system further comprises first and second end plates that secure the first section above the second section such that the dividing wall is interposed between the first and second extensions.

In some embodiments, a lithographic apparatus comprises an illumination system for generating a radiation beam. The illumination system comprises a plasma chamber, electrodes for igniting a plasma, a flow system, and a collection system. The flow system generates a circulating gas flow through a circular flow path within the plasma chamber. The flow system also removes particles around the electrodes. The collection system is disposed in the circular flow path. The collection system collects the particles. The collection system comprises a first section comprising an elongated plate having a squared edge, an opposed tapered edge, a first surface, an opposed second surface, and first and second extensions extending from the opposed second surface. The collection system further comprises a second section comprising first and second chambers with a dividing wall between the chambers. The first chamber comprises a planar surface on an exterior side of the first chamber and is disposed facing the opposed second surface. The second chamber comprises a sloped surface on an exterior side of the second chamber and is disposed facing the tapered edge. The collection system further comprises first and second end plates that secure the first section above the second section such that the dividing wall is interposed between the first and second extensions.

In some embodiments, a passive particle collection device comprises a first section comprising an elongated plate having a squared edge, an opposed tapered edge, a first surface, an opposed second surface, and first and second extensions extending from the opposed second surface. The passive particle collection device further comprises a second section comprising first and second chambers with a dividing wall between the chambers. The first chamber comprises a planar surface on an exterior side of the first chamber and is disposed facing the opposed second surface. The second chamber comprises a sloped surface on an exterior side of the second chamber and is disposed facing the tapered edge. The passive particle collection device further comprises first and second end plates that secure the first section above the second section such that the dividing wall is interposed between the first and second extensions. The opposed second surface and the planar surface are spaced apart by a distance in a range of 10 mm to 60 mm. The first chamber has a first cross-sectional area. The second chamber has a second cross-sectional area. The first cross-sectional area is larger than the second cross-sectional area. The tapered edge forms an angle in a range of 5° to 25° with respect to the opposed second surface. The sloped surface forms an angle in a range of 7° to 35° with respect to the opposed second surface. The slope edge and the sloped surface form a tapered inlet of the passive particle collection device. The tapered inlet is wider at an exterior of the passive particle collection device than at an interior of the passive particle collection device. The passive particle collection device is configured to receive particles via the tapered inlet. The passive particle collection device is positioned such that at least a portion of the particles is captured at the second chamber. The dividing wall interposed between the first and second extensions defines a maze-like structure. The maze-like structure is configured to guide a gas flow through the passive particle collection device. The first and second chambers are entrapment areas configured to capture the particles from the gas flow.

In other general aspects, a dust collector for a gas discharge chamber of a light source includes a collector body defining an inlet port fluidly communicating with a cavity of the gas discharge chamber along an inflow direction, an outlet port fluidly communicating with the cavity of the gas discharge chamber along an outflow direction such that a flow path is defined from the inlet port to the outlet port, and a collection pocket in fluid communication with the inlet port and the outlet port. The collector body includes a baffle between the inlet port and the outlet port and extending transverse to at least one of the inflow direction and the outflow direction.

Implementations can include one or more of the following features. For example, the baffle can extend toward the collection pocket. The baffle and the collector body can be configured to direct dust particles from the inlet port into the collection pocket. The baffle can extend perpendicularly to the at least one of the inflow direction and the outflow direction. The collector body can include a first section body and a second section body, the first section body including the baffle, and the inlet port and the outlet port each being defined between the first section body and the second section body. The collector body can define only a single collection pocket. The collector body can include a plurality of baffles between the inlet port and the outlet port, each baffle extending transverse to at least one of the inflow direction and the outflow direction. The collector body can define a plurality of collection pockets, with each collection pocket being associated with a baffle. The collector body including the baffle can be made of a nickel-plated metal, a bare metal, copper, brass, an alloy of nickel and copper, an alloy of copper, or Monel. The dust collector can have no moving parts or electronics.

In other general aspects, an illumination system is configured to condition a radiation beam. The illumination system includes: a gas discharge chamber configured to confine a gas; electrodes inside the gas discharge chamber; a flow system configured to generate a flow of the gas within the gas discharge chamber along a flow path; and a passive dust collector disposed along the flow path. The passive dust collector includes: a collector body defining an inlet port fluidly communicating with a cavity of the gas discharge chamber along an inflow direction, an outlet port fluidly communicating with the cavity of the gas discharge chamber along an outflow direction such that a flow path is defined from the inlet port to the outlet port, and a collection pocket in fluid communication with the inlet port and the outlet port. The collector body includes a baffle between the inlet port and the outlet port and extending transverse to at least one of the inflow direction and the outflow direction.

Implementations can include one or more of the following features. For example, the gas can include fluorine, neon, krypton, or argon. The flow system can include an exhaust fan configured to direct dust and gas along the flow path.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
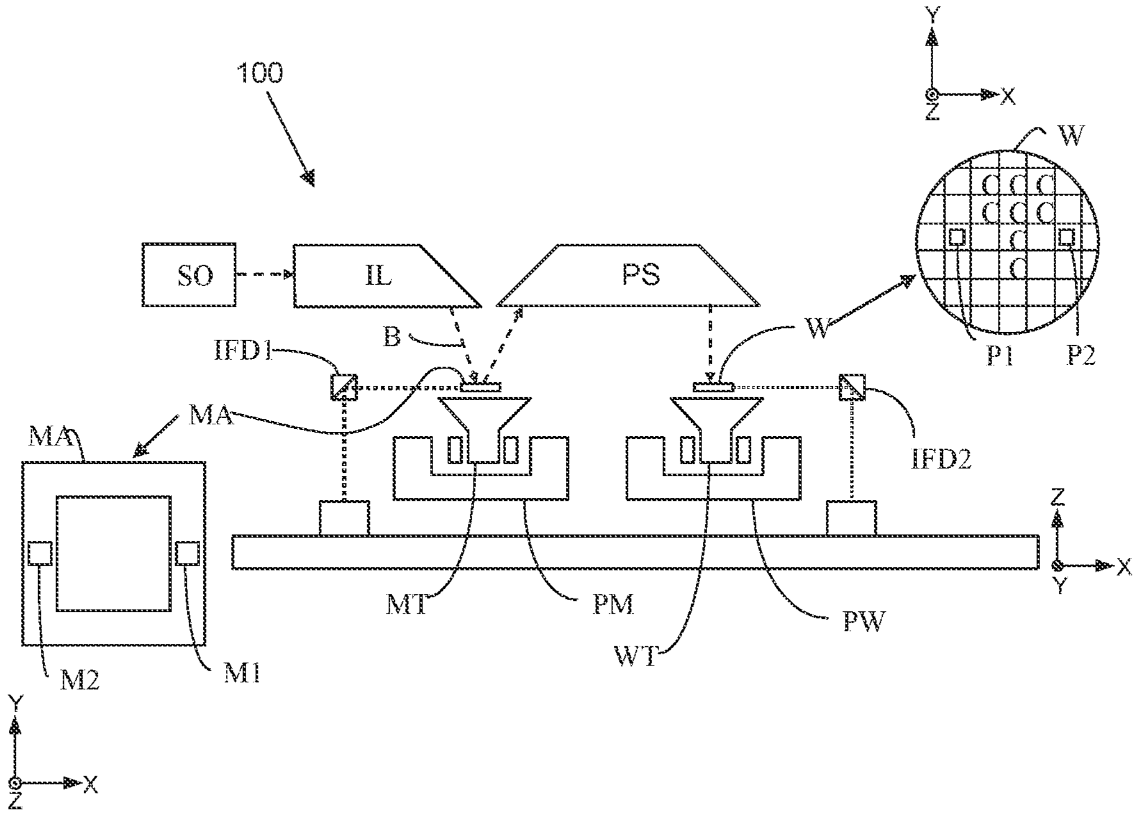
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an exemplary embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as “beneath,” “below,” “lower,” “above,” “on,” “upper” and the like, can be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term “about” as used herein indicates the value of a given quantity that can vary based on a particular technology. Based on the particular technology, the term “about” can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a non-transitory machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
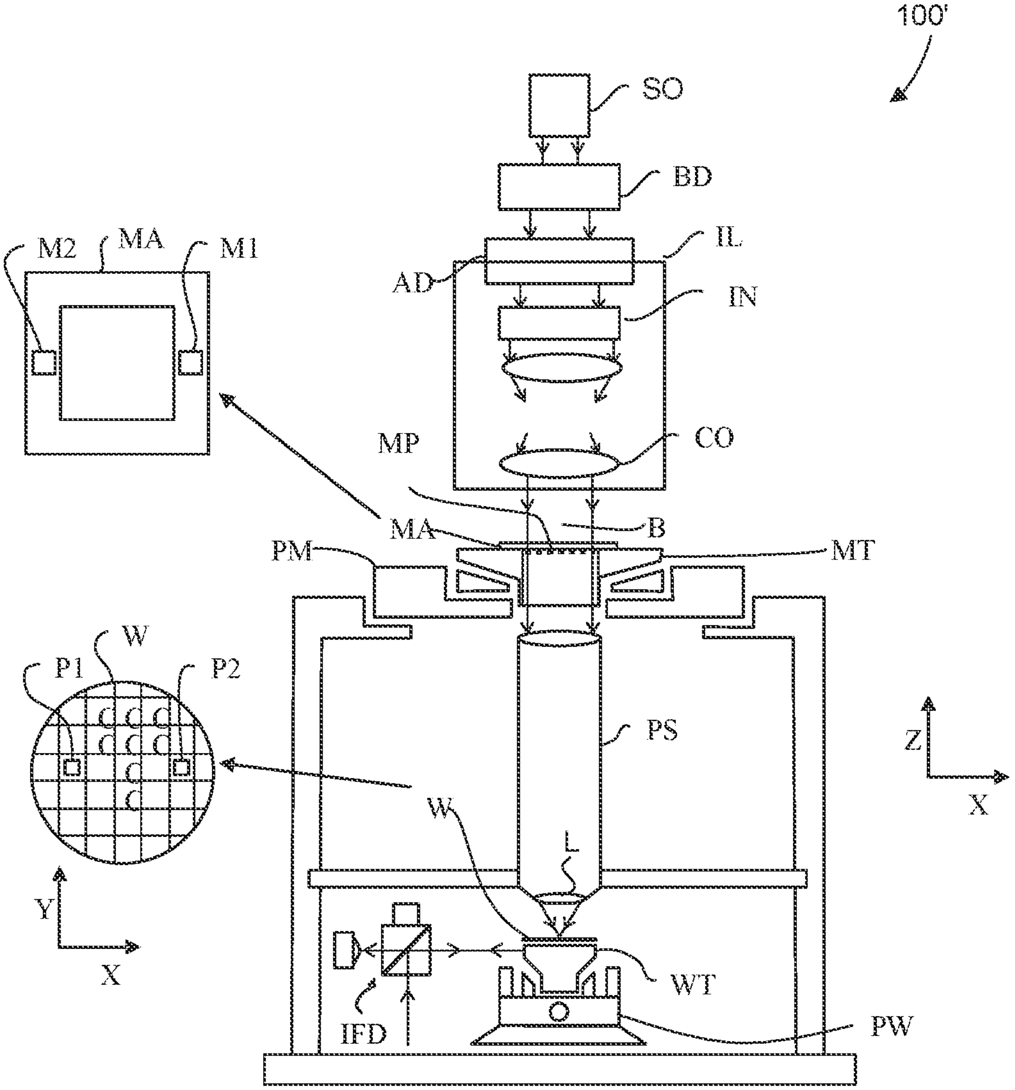
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term “patterning device” MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term “projection system” PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such “multiple stage” machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate.

An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IFD2 (for example, an interferometric device, linear encoder, or capacitive sensor), the substrate table WT may be moved accurately (for example, so as to position different target portions C in the path of the radiation beam B). Similarly, the first positioner PM and another position sensor IFD1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W.

The projection system PS projects an image of the mask pattern MP, where the image is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction.

With the aid of the second positioner PW and position sensor IFD (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

The lithographic apparatus 100 and 100' may be used in at least one of the following modes:

In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted (i.e. "stepped") in the X and/or Y direction so that a different target portion C may be exposed.

In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, lithographic apparatus 100' includes a deep ultraviolet (DUV) source, which is configured to generate a beam of DUV radiation for DUV lithography. A DUV source may be, for example, a gas discharge laser (e.g., an excimer laser).

Example Lithographic Cell

Figure 2:
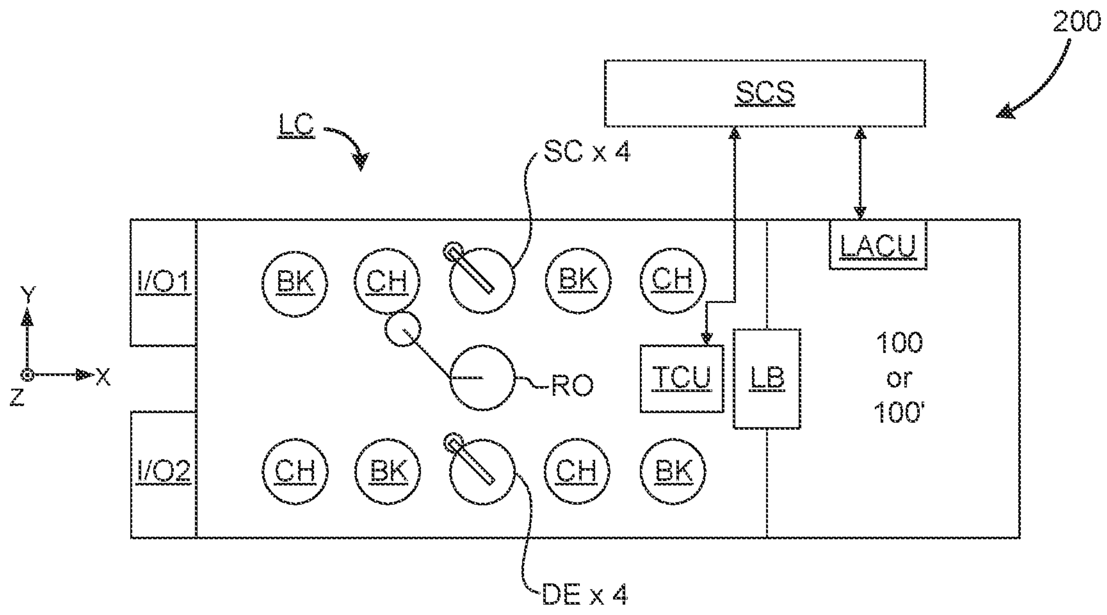
FIG. 2 shows a schematic of a lithographic cell, according to some embodiments.

FIG. 2 shows a lithographic cell 200, also sometimes referred to a lithocell or cluster, according to some embodiments. Lithographic apparatus 100 or 100' may form part of lithographic cell 200. Lithographic cell 200 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Example Passive Dust Traps

In lithographic processes, a stable illumination source or system (such as the radiation source SO) is conducive to accurate and error-free fabrication of nanoscale integrated circuits. Particularly, stable illumination intensity may allow for predictable dosing of illumination energy on photoresist. If the illumination is unstable, then photoresist may not fully develop, which may cause printing errors. In some illumination sources for lithographic applications, a presence of contamination may adversely impact the intensity of illumination output, causing errors in dosages. A pulsed-discharge laser is one example of an illumination source used for DUV lithography. The pulsed-discharge laser may use a gas medium that, when a voltage pulse is applied to the gas medium, ionizes the gas and releases DUV radiation. Each pulse may generate a contaminant (e.g., dust particles) as a result of the gas medium interacting with the voltage-supplying electrodes. There is a risk that the contaminant may then be in the path of the DUV radiation, resulting in an unpredictable fluctuation of DUV intensity.

Figure 3A:
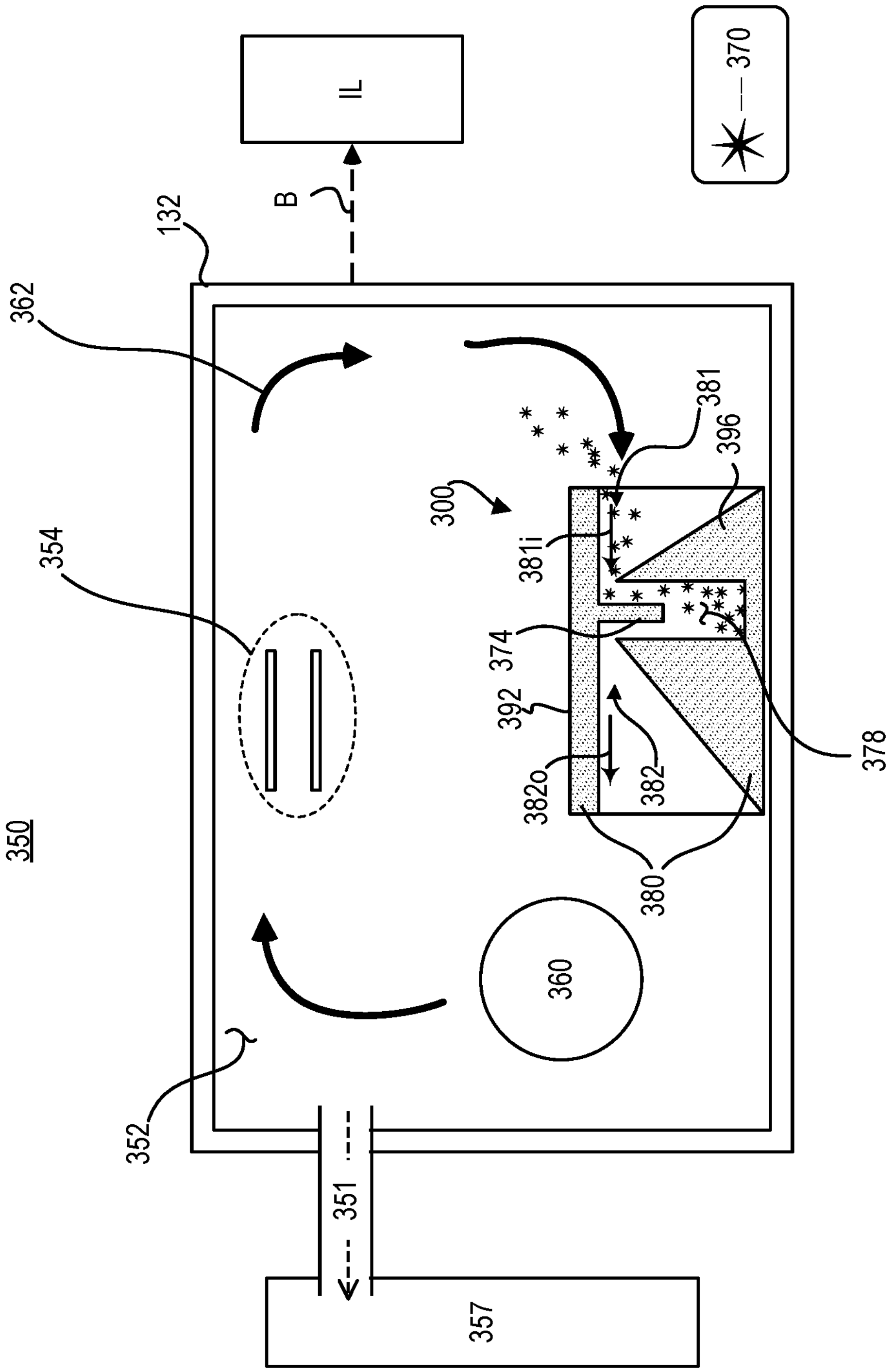
FIG. 3A is a block diagram of a system for dust collection within an illumination system such as that shown in FIGS. 1A and 1B, the dust collection system being a dust collector.

Referring to FIG. 3A, an illumination system (such as the radiation source SO) 350 is configured to condition a radiation beam B. The illumination system 350 includes at least one gas discharge chamber 352 configured to confine a gas (that includes a gain medium such as, for example, a combination of one or more noble gases and a reactive gas such as fluorine or chlorine). The illumination system 350 also includes an energy source 354 such as a pair of electrodes inside the gas discharge chamber 352. The illumination system 350 includes a flow system 360 (such as an exhaust fan or a blower) configured to generate a flow of gas (gas flow) within the gas discharge chamber 352 along a flow path 362.

The gas flow within the gas discharge chamber 352 can also be directed by the flow system 360 to an outflow path 351 that is fluidly connected with one or more other filtering devices such as an active dust trap 357. For example, the external filtering device can have access to gas discharge chamber 352 via associated plumbing (e.g., inlet, outlet, ducting, and the like) that define the outflow path 351. The external filtering system may be, for example, a metal-fluoride trap (MFT) for producing ultra-purified gas in small quantities (e.g., to blow-clean optical elements in illumination system 500).

Additionally, the illumination system 350 includes a passive contaminant trap 300 disposed along the flow path 362. While the passive contaminant trap 300 is depicted in this block diagram in two-dimensional form, it should be noted that the trap 300 extends into and out of the page to form a three-dimensional body, as shown and discussed with respect to the implementation of FIG. 3B. Moreover, the flow of the any material through the trap 300 may be contained by components not shown in FIG. 3A (such as the end plates 332*a*, 332*b* of FIG. 3B). The passive contaminant trap 300 within the gas discharge chamber 352 works in parallel with the active dust trap 357. In particular, because the passive contaminant trap 300 is inside the gas discharge chamber 352, it can operate more quickly than the active dust trap 357 to clean the gas discharge chamber 352 (and remove the dust particles). The passive contaminant trap 300 can be re-used or reclaimed when a gas discharge chamber 352 is replaced because of the ease of cleaning the passive contaminant trap 300.

Embodiments herein include structures and functions for the passive contaminant trap 300 that is placed in the path of the gas flow (the flow path 362) to capture contaminant or dust particles 370 and prevent such fluctuations of DUV intensity in the radiation beam B produced by the gas discharge chamber 352. The passive contaminant trap 300 can be referred to as a dust collector for the gas discharge chamber 352, which can be a component of a light source that supplies the radiation beam B to the illuminator IL (see also FIGS. 1A and 1B). In general, the dust collector 300 includes: a collector body 380 defining an inlet port 381 fluidly communicating with a cavity defined by the gas discharge chamber 352 along an inflow direction 381*i*, and an outlet port 382 fluidly communicating with the cavity of the gas discharge chamber 352 along an outflow direction 3820 such that a flow path is defined from the inlet port 381 to the outlet port 382. The collector body 380 defines a dust collection chamber (which can be referred to as a "collection pocket") 378 in fluid communication with the inlet port 381 and the outlet port 382. The collector body 380 includes an extension (such as a baffle) 374 between the inlet port 381 and the outlet port 382 and extending transversely to at least one of the inflow direction 381*i* and the outflow direction 382*o*. Implementations of the dust collector are discussed below with reference to FIGS. 3B, 4, 8A, and 8B, while operation of the dust collector 300 are discussed below with reference to FIGS. 5, 6A, and 6B.

In some implementations, the baffle 374 is configured to extend toward the collection pocket 378. The baffle 374 and the collector body 380 are configured to direct dust particles 370 from the inlet port 381 into the collection pocket 378. The baffle 374 extends transversely to the at least one of the inflow direction 381*i* and the outflow direction 382*o*. In some implementations, the collector body 380 includes a first section body 392 and a second section body 396, the first section body 392 including the baffle 374, and the inlet port 381 and the outlet port 382 each being defined between the first section body 392 and the second section body 396. The baffle (or extension) 374 generally extends along a direction away from the first section body 392 and this direction is transverse to at least one of the inflow direction 381*i* and the outflow direction 382*o*.

The direction of the baffle 374 is transverse to a direction as long as it is not parallel with that direction. Thus, in some implementations, the direction of the baffle 374 can be perpendicular to (oriented at 90° relative to) the at least one inflow direction 381*i* and outflow direction 382*o*. In other implementations, the direction of the baffle 374 can be oriented at an angle that is between 0° and 90° relative to either the inflow direction 381*i* or the outflow direction 382*o*. For example, the baffle 374 can be at 45° relative to one or both of the inflow direction 381*i* and the outflow direction 382*o*.

Figure 3B:
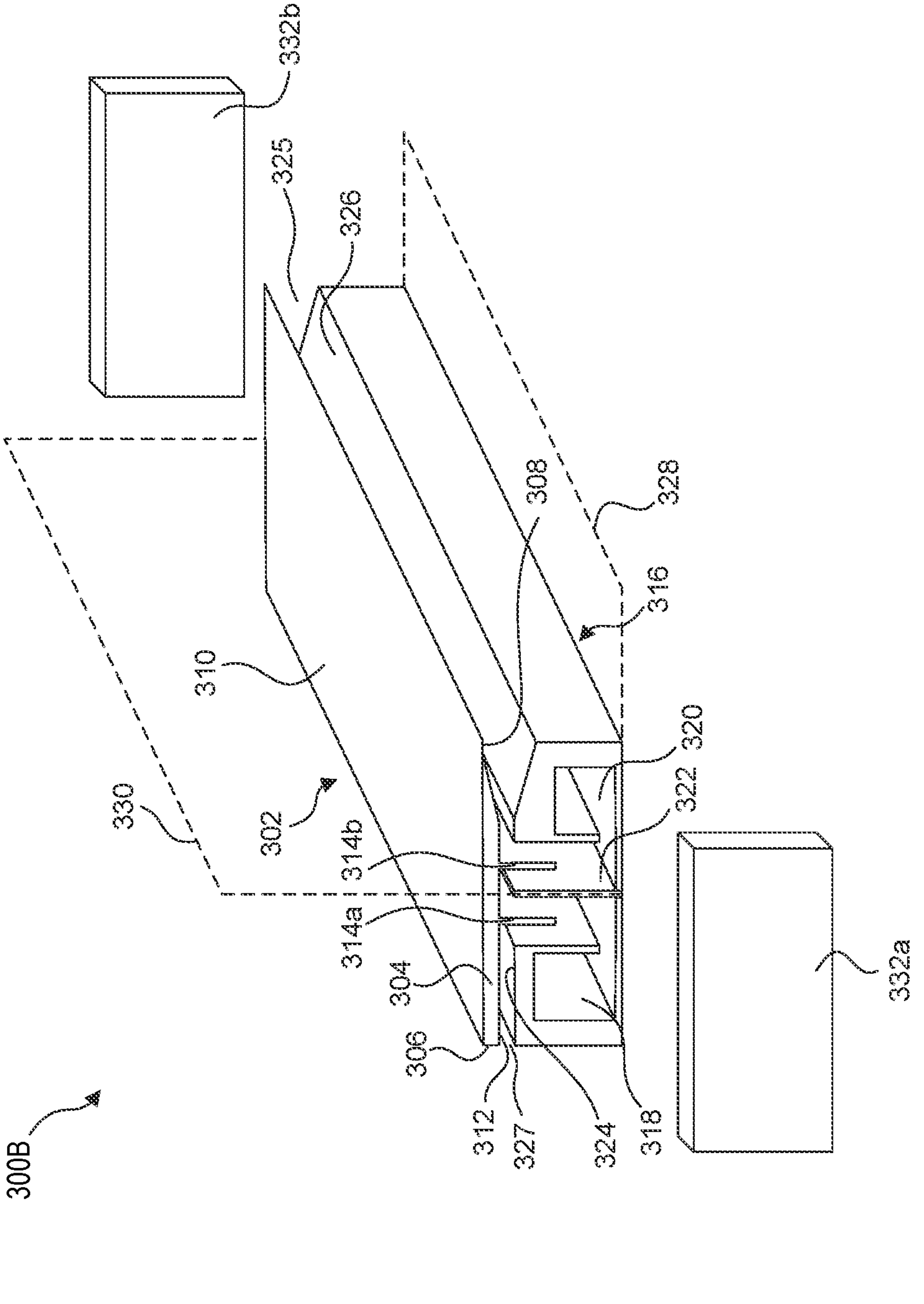
FIGS. 3B and 4 show systems for dust collection (dust collectors), according to some embodiments.
Figure 8A:
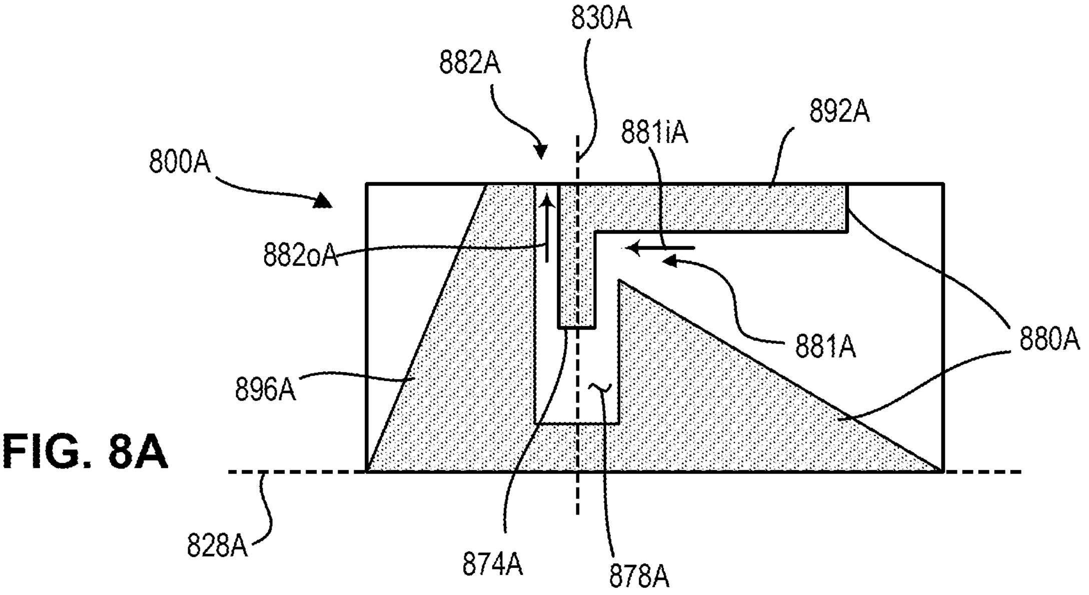
FIGS. 8A and 8B show block diagrams of other embodiments of the dust collector of FIG. 3A.
Figure 8B:
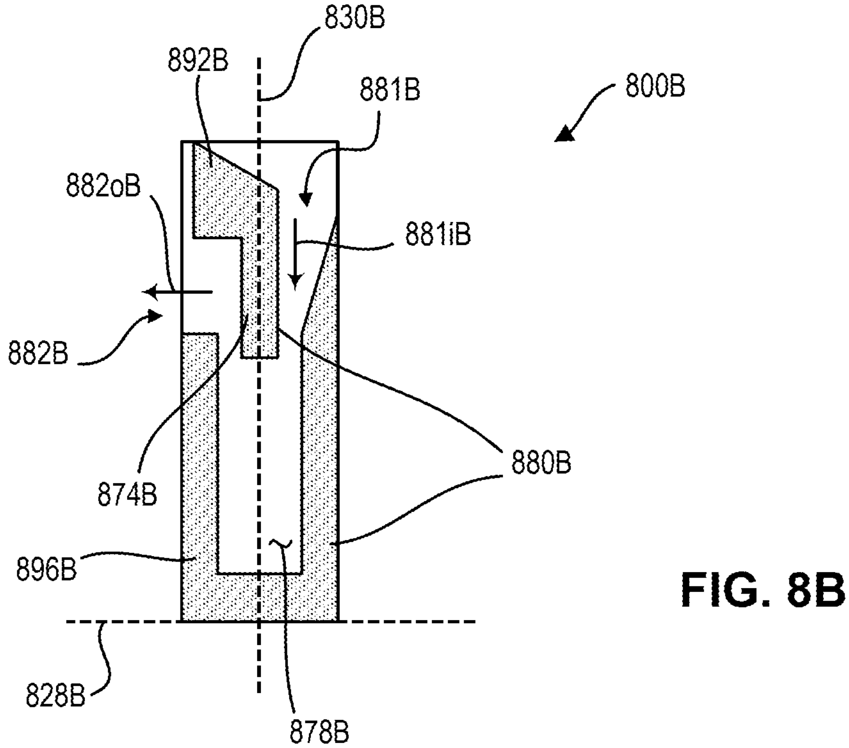

In some implementations, such as shown in FIGS. 3A, 8A, and 8B, the collector body 380 defines a single collection pocket 378. In some implementations, such as shown in FIG. 3B, the collector body 380 includes a plurality of baffles (314*a*, 314*b*) between the inlet port 381 and the outlet port 832, and each baffle 314*a*, 314*b* extends across (or transverse to) at least one of the inflow direction 381*i* and the outflow direction 382*o*. In these implementations, the collector body 380 can define a plurality of collection pockets (such as pockets 318, 320 of FIG. 3B), with each collection pocket 318, 320 being associated with a respective baffle 314*a*, 314*b*.

FIG. 3B shows a perspective view of an implementation 300B of the system 300 of FIG. 3A, according to some embodiments. In some embodiments, system 300B may be referred to as a contaminant capture device, a dust collector, a passive dust trap, and the like. System 300B may comprise a section 302 (e.g., a "first section" or "first portion") and a section 316 (e.g., a "second section" or "second portion"). It should be appreciated that, in some embodiments, enumerative adjectives (e.g., "first," "second," "third," or the like) may be used as a naming convention and are not intended to indicate an order or hierarchy (unless otherwise noted). For example, the terms "first section" and "second section" may distinguish two sections, but need not specify if the sections have a particular order or hierarchy. Furthermore, an element in a drawing is not limited to any particular enumerative adjective. For example, section 302 may just as well be referred to as a second section, with the other section(s) having appropriately distinguishing enumerative adjective (s).

In some embodiments, section 302 may comprise an elongate plate 304. Elongate plate 304 may comprise a squared edge 306, a tapered edge 308, a surface 310 (e.g., a "first surface"), a surface 312 (e.g., a "second surface"), an extension (or baffle) 314*a* (e.g., a "first extension"), and an extension (or baffle) 314*b* (e.g., a "second extension"). Extensions 314*a* and 314*b* may extend from surface 312. Section 316 may comprise a chamber 318 (e.g., a "first chamber"), a chamber 320 (e.g., a "second chamber"), and a dividing wall 322. On an exterior side of chamber 318, chamber 318 may comprise a planar surface 324 disposed facing surface 312. On an exterior side of chamber 320, chamber 320 may comprise a sloped surface 326. Sloped surface 326 may be disposed facing tapered edge 308 so as to define a tapered opening 325 (or funnel-shaped opening). Tapered opening 325 may be an inlet of system 300B, for example, when it is used as a passive dust trap. A gap between squared edge 306 and planar surface 324 may define an opening 327. The gap may be approximately 10 mm to 60 mm, 15 mm to 50 mm, or 20 mm to 40 mm. Other suitable gap spacings may be used in some embodiments. Opening 327 may be an outlet for system 300B. For clarifying some descriptions, a horizontal plane 328 and a vertical plane 330 are drawn in FIG. 3B. The tapered inlet 325 can be wider at an exterior of system 300B than at an interior of system 300B.

In some embodiments, system 300B may further comprise an end plate 332*a* (e.g., a "first end plate" or "first side wall") and an end plate 332*b* (e.g., a "second end plate" or "second side wall"). End plates 332*a* and 332*b* can provide structural support to sections 302 and 316. Parts of section 302 are not directly in contact with any part of section 316. Therefore the two sections 302 and 316 are spaced apart from one another, but rigidly held together by end plates 332*a* and 332*b*. End plates 332*a* and 332*b* may secure section 302 above section 316 such that dividing wall 322 is interposed between extensions 314*a* and 314*b*.

In some embodiments, the various parts of system 300B may be constructed of material related to the environment system 300B is to be implemented in (e.g., corrosive-resistant). For example, section 302, section 316, end plate 332*a*, and/or end plate 332*b* may comprise a metal that is plated, or otherwise coated, with a non-reactive material (e.g., a material that is non-reactive toward the species it will encounter). The metal body may comprise aluminum, stainless steel, or similar suitable materials. Aluminum may be easy to machine and is light weight. The non-reactive material may comprise nickel. The non-reactive material can include a nickel-plated metal, a bare metal, copper, brass, an alloy of nickel and copper, an alloy of copper, or Monel.

Figure 4:
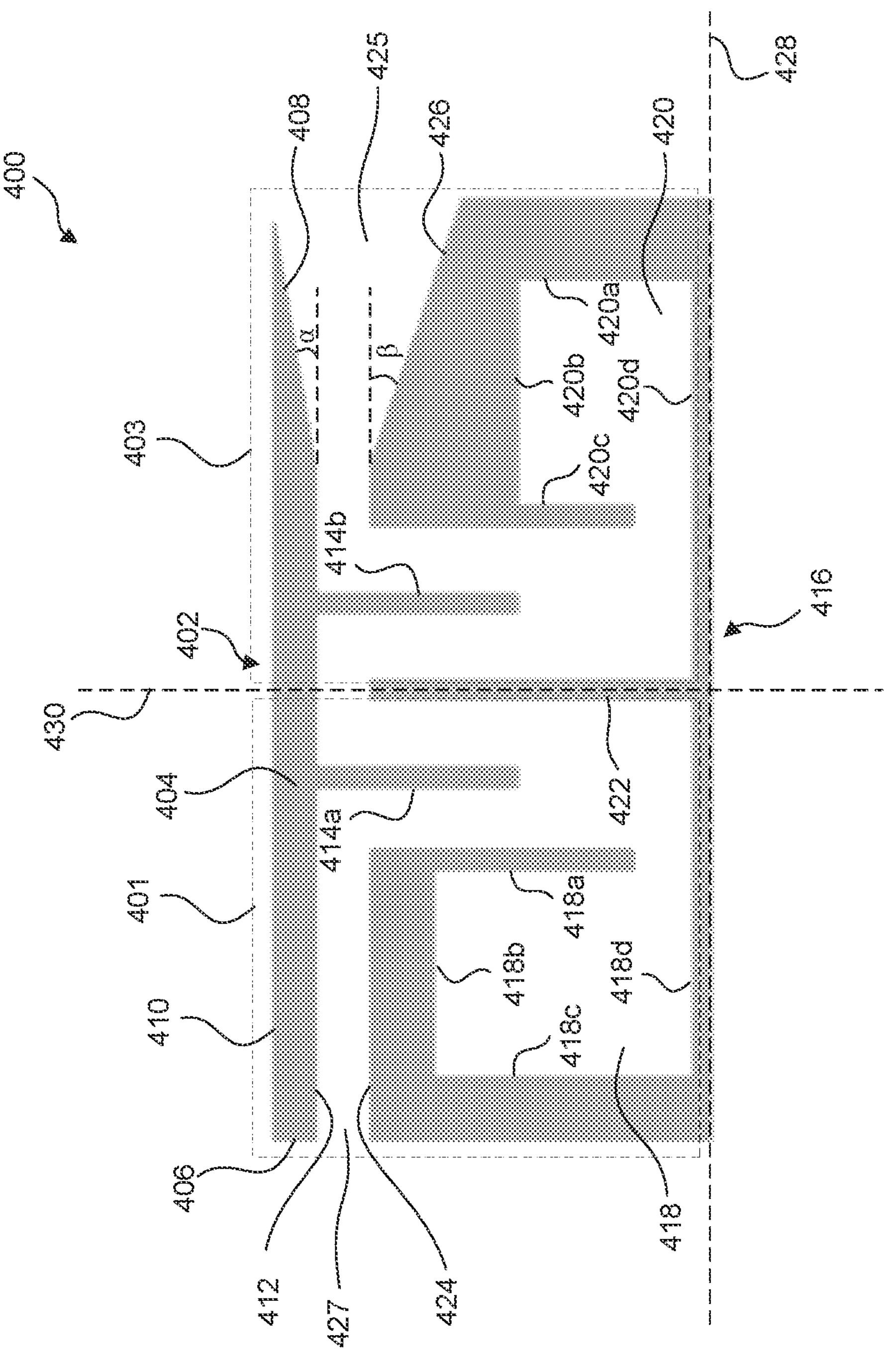

FIG. 4 shows a cross-sectional view of system 400. In some embodiments, system 400 may represent another view of system 300B (FIG. 3B). Unless otherwise noted, structures and functions described previously for elements of FIG. 3B may also apply to similarly numbered elements of FIG. 4 (e.g., reference numbers sharing the two right-most numeric digits). Structures and functions of elements of FIG. 4 should be apparent from descriptions of corresponding elements of FIG. 3B. System 400 may comprise a region 401 (e.g., "first region" or "left region") and a region 403 (e.g., "second region" or "right region"). Region 401 may comprise the indicated elements in FIG. 4, for example, part of section 402, part of elongated plate 404, squared edge 406, part of surface 410, part of surface 412, extension 414*a*, part of section 416, part of the maze-like structure, chamber 418, part of dividing wall 422, planar surface 424, and opening 427. Similarly, region 403 may comprise the indicated elements in FIG. 4, for example, part of section 402, part of elongated plate 404, tapered edge 408, part of surface 410, part of surface 412, extension 414*b*, part of section 416, part of the maze-like structure, chamber 420, part of dividing wall 422, opening 425, and sloped surface 426. Dividing wall 422 may define a separation between regions 401 and 403.

In some embodiments, chamber 418 may be a region that is partially enclosed on three or more sides of its cross section (e.g., enclosed by walls 418*a*, 418*b*, 418*c*, and 418*d*, which may define an interior of chamber 418). Chamber 418 may comprise a cross-sectional area (e.g., a "first cross-sectional area") defined by walls 418*a*, 418*b*, 418*c*, and 418*d*. Chamber 420 may be a region that is partially enclosed on three or more sides of its cross section (e.g., enclosed by walls 420*a*, 420*b*, 420*c*, and 420*d*, which may define an interior of chamber 420). Chamber 420 may comprise a cross-sectional area (e.g., a "second cross-sectional area") defined by walls 420*a*, 420*b*, 420*c*, and 420*d*. The cross-sectional area of chamber 418 may be larger than the cross-sectional area of chamber 420. Though not shown, in some embodiments, the cross-sectional area of chamber 418 may be smaller than, equal to, the cross-sectional area of chamber 420. Chamber 418 may comprise planar surface 424 on an exterior side of chamber 418. Planar surface 424 may be disposed facing surface 412. Chamber 420 may comprise sloped surface 426 on an exterior side of chamber 420. Sloped surface 426 may be disposed facing tapered edge 408.

In some embodiments, tapered edge 408 may comprise an angle α with respect to surface 412 of section 402 (which may also be parallel with horizontal plane 428). The angle α may be in a range of approximately 5° to 25°, 7° to 20°, or 10° to 15°. In some embodiments, sloped surface 426 may comprise an angle β with respect to a surface parallel to horizontal plane 428 (e.g., can also be with respect to surface 412 or planar surface 424). The angle β may be in a range of approximately 7° to 35°, 10° to 30°, or 12° to 20°. Other suitable angles α and β may be used in some embodiments In some embodiments, dividing wall 422 of section 416 does not touch section 402. Similarly, extensions 414*a* and 414*b* of section 402 do not touch section 416. The maze-like structure defined by extensions 414*a* and 414*b* and dividing wall 422 may guide a gas flow from tapered opening 425 and toward opening 427. A gap between squared edge 406 and planar surface 424 may define an opening 427. Chambers 418 and 420 may be entrapment areas for capturing particles present in the gas that flows through the maze-like structure (see e.g., FIG. 6B).

Figure 5:
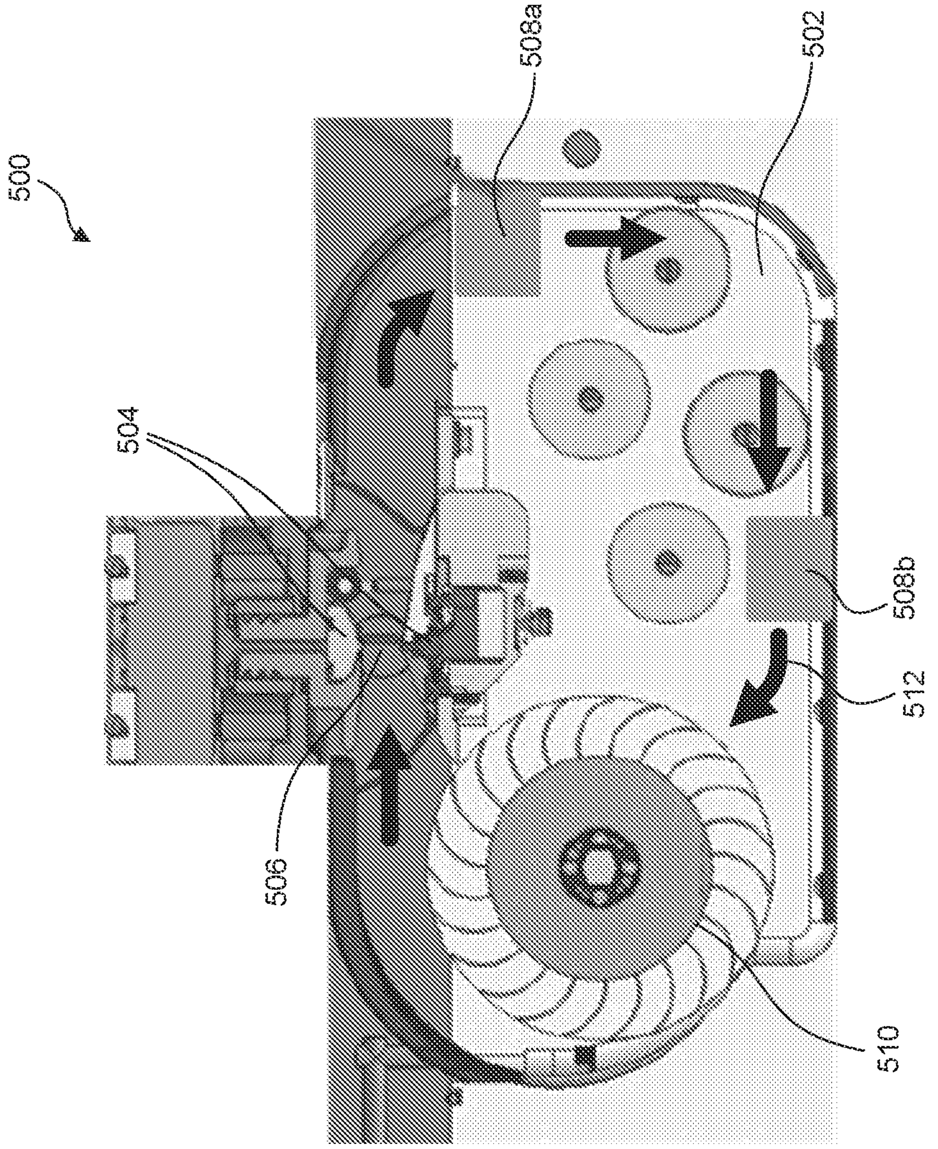
FIG. 5 shows an illumination system, according to some embodiments.

FIG. 5 shows an illumination system 500, according to some embodiments. In some embodiments, illumination system 500 may be used in a lithographic apparatuses 100 or 100' as illumination source SO (FIGS. 1A and 1B). Illumination system 500 may comprise a plasma chamber 502, electrodes 504, dust collection systems 508*a* and 508*b*, and a flow system 510. In some non-limiting examples, flow system may be a blower (such as an exhaust fan) or an external pressure system that is connected to plasma chamber 502 via plumbing. In some embodiments, systems 300, 300B, or 400 (FIGS. 3A, 3B, and 4) may be implemented in illumination system 500 as dust collection system 508*a* and/or dust collection system 508*b*.

In some embodiments, plasma chamber 502 may confine a gas. The gas may be a fluoride-based gas. The gas may comprise fluorine, neon, krypton, argon, or other similar species (for example, argon fluoride). To generate radiation (e.g., by lasing), a voltage pulse may be supplied to the gas (e.g., via electrodes 504) to generate a plasma at plasma region 506. The generated plasma can release radiation, thereby acting as a radiation source (e.g., illumination source). In the process of generating radiation, the gas and electrodes 504 may interact chemically. For example, a material of electrodes 504 (e.g., copper) may interact with the fluoride gas in plasma chamber 502 to create a metal-fluoride byproduct. The metal-fluoride byproduct may become a dust contaminant that absorbs radiation in subsequent radiation pulses. Therefore, the gas flow may optimize the production of radiation (e.g., DUV) by circulating the spent gas and contaminants out of the plasma-generation zone while supplying unspent gas for the next plasma ignition. Flow system 510 may generate a gas flow 512.

In some embodiments, the buildup of gas contaminants may be treated by using dust collection systems 508*a* and/or 508*b*. Illumination system 500 may comprise other filtering devices that work in parallel with dust collection systems 508*a* and/or 508*b*. For example, an external filtering system may have access to plasma chamber 502 via associated plumbing (e.g., inlet, outlet, ducting, and the like) (not shown). The external filtering system may be, for example, a metal-fluoride trap (MFT) for producing ultra-purified gas in small quantities (e.g., to blow-clean optical elements in illumination system 500). In order to significantly reduce the burden on the external filtering system, dust collection systems 508*a* and/or 508*b* may be used as the primary dust removal systems that remove most of the dust from plasma chamber 502 and prevent dust saturation. For maximum dust collection, a length of dust collection systems 508*a* and/or 508*b* (e.g., length into the page) may be approximately equal to a length of a length of plasma chamber 502 (e.g., length into the page).

In some embodiments, dust collection system 508*a* and/or dust collection system 508*b* may correspond to systems 300, system 300B, or 400 (FIGS. 3A, 3B, and 4). Dust collection systems 508*a* and/or 508*b* may be passive dust traps that have no moving parts or electronics. Dust collection systems 508*a* and/or 508*b* may operate by being in the path of gas flow 512 so as to receive the contaminants through an inlet (e.g., inlet port 381 (FIG. 3A) or tapered opening 425 (FIG. 4)). Dust collection chambers 318 and 320 (FIG. 3B) may be designed with enough capacity to last throughout the operable lifespan of illumination system 500 without needing to replace or service the dust collection systems.

In some embodiments, an operator may attempt to access a failing component within illumination system 500 by performing a system teardown. However, such a teardown and reassembly may be highly complex and incur significant cost. This may be particularly true of plasma chamber 502, which may encompass a multitude of complex sensors, structural layers, vacuum system, gas supply, electrical system, alignment calibrations, and the like. Therefore, the operable lifespan of illumination system 500 may be said to depend on whichever critical component wears beyond a conformity threshold (e.g., some wear that would result in illumination system 500 operating poorly or not at all).

In some embodiments, dust collection systems 508*a* and/or 508*b* may be simple mesh filters that line the floor and the walls of plasma chamber 502. However, mesh filters may saturate and become useless well before any of the other degradable components of illumination system 500 reach their end-of-life. If the dust filtration mechanisms are the earliest to fail, then using high-capacity dust collectors such as system 300 (FIG. 3A), system 300B (FIG. 3B), or system 400 (FIG. 4) may effectively increase the operable lifespan of plasma chamber 502 and illumination system 500. Furthermore, when passive dust traps (e.g., system 300 (FIG. 3A)) are removed after illumination system 500 reaches its end-of-life, the passive dust traps may be easily cleaned and refurbished for reuse.

In some embodiments, electrodes 504 are an example of a component that may have a limited life expectancy (e.g., due to erosion due to chemical interaction of gas and electrode). Erosion of electrodes 504 is an expected consequence of its operation and has a predictable rate. Another example of a component with a limited life expectancy may be an optical window that allows radiation to exit illumination system 500 (window not shown) (e.g., window can absorb illumination and become structurally unstable over time). Yet another example of a degradable component may be a filtration system (e.g., mesh filters along the walls of system 500 or an external MFT that may become saturated over time). By using high-capacity dust collectors such as system 300 (FIG. 3A), system 300B (FIG. 3B), or system 400 (FIG. 4), such dust collection systems can outlast other degradable components of illumination system 500.

Figure 6A:
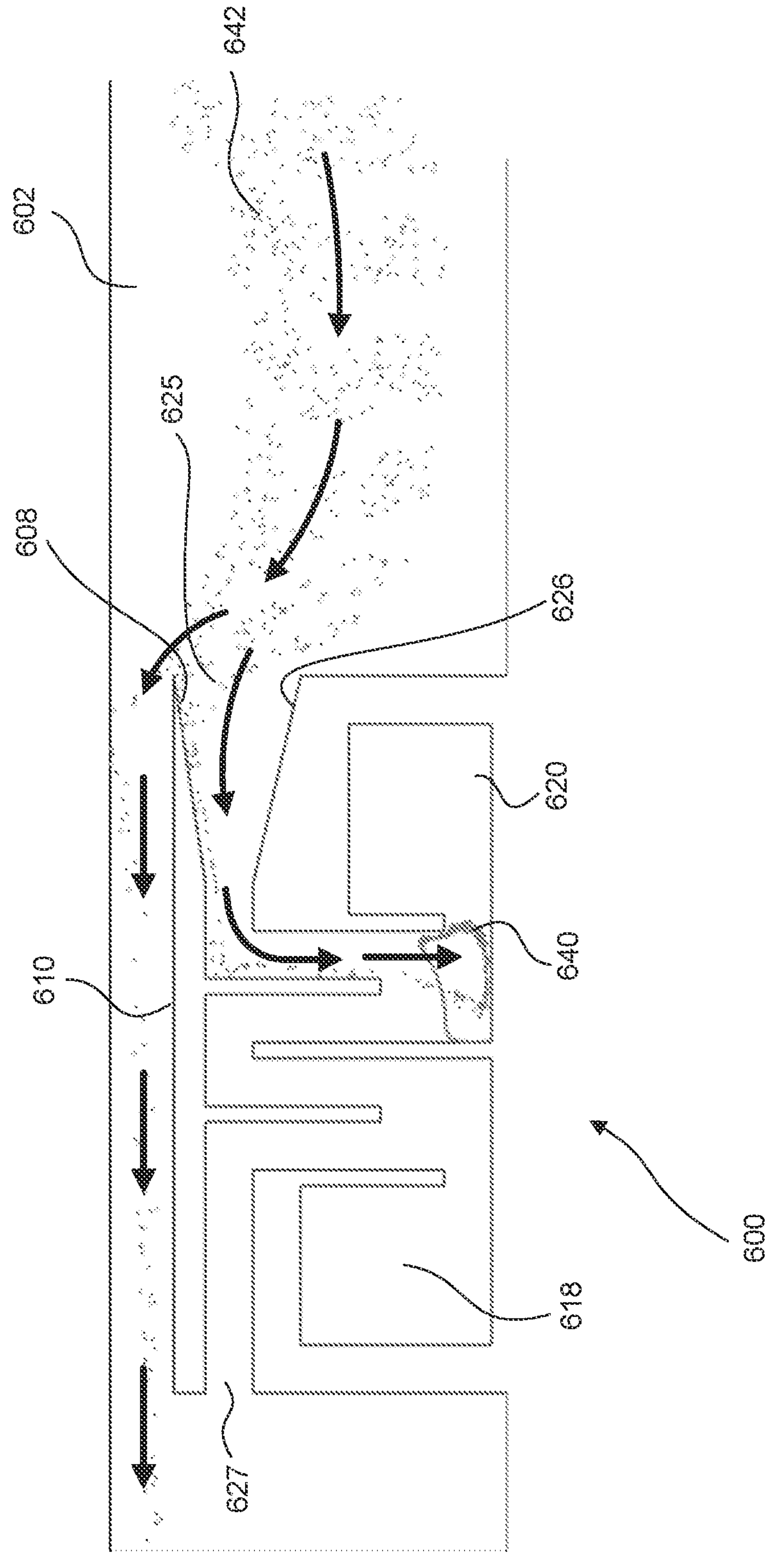
FIGS. 6A and 6B show computer simulations of a system in operation, according to some embodiments.
Figure 6B:
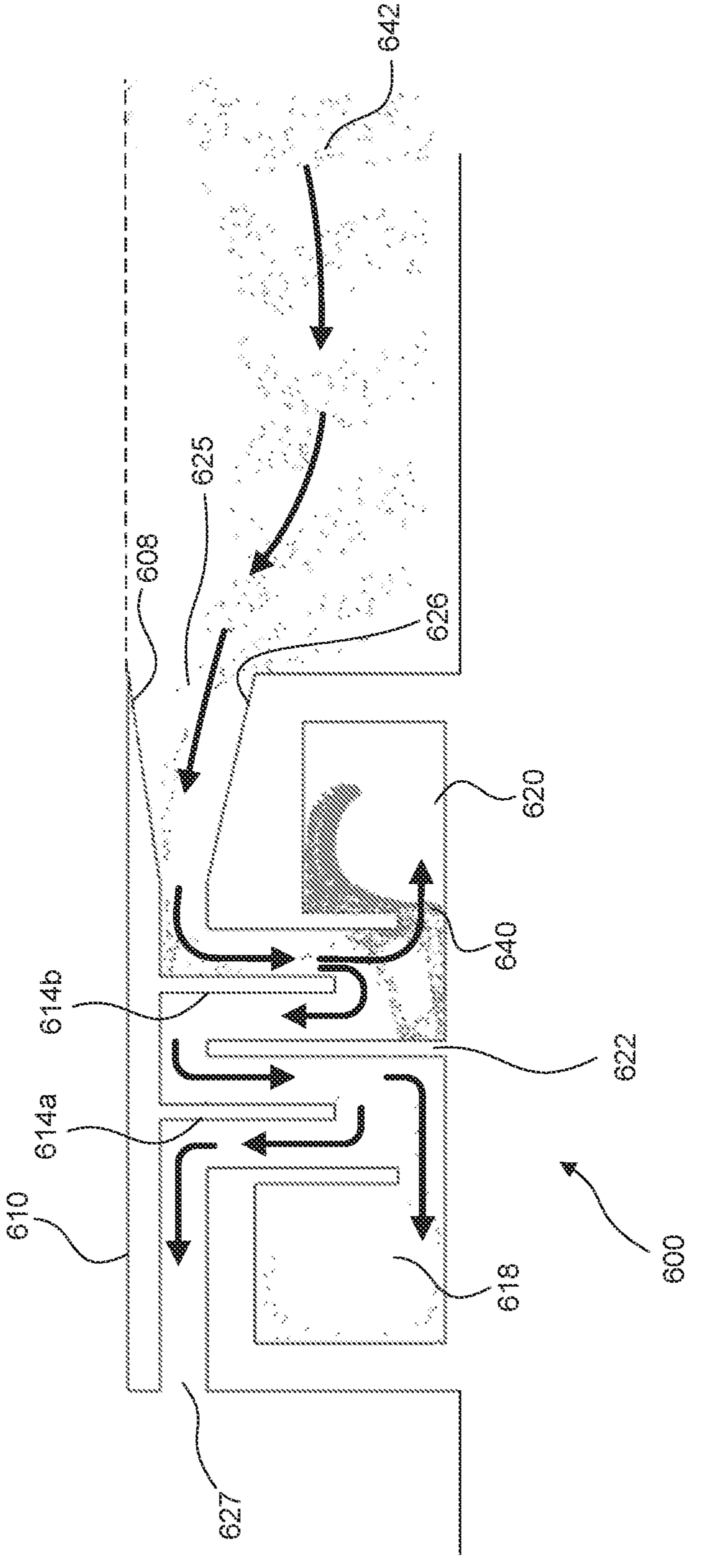

FIGS. 6A and 6B show computer simulations of a system 600 in operation. In some embodiments, system 600 may also represent systems 300, 300B, and 400 (FIGS. 3A, 3B, and 4). Unless otherwise noted, structures and functions described previously for elements of FIGS. 3A, 3B, and 4 may also apply to similarly numbered elements of FIGS. 6A and 6B (e.g., reference numbers sharing the two right-most numeric digits). Structures and functions of elements of FIGS. 6A and 6B should be apparent from descriptions of corresponding elements of FIGS. 3A, 3B, and 4.

In some embodiments, system 600 may be implemented in a gas chamber in which gas-borne contamination may be present (e.g., plasma chamber 502 (FIG. 5)). The noted parts of system 600 are chambers 618 and 620, tapered edge 608 and sloped surface 626 (which form tapered opening 625), and surface 610. Contamination is represented by dust particles 642. Arrows indicate gas flow direction. Dust particle flow 640 can represent one example of how dust contamination may flow within system 600. The dust particle sizes used for the simulation had a span (e.g., length, width, or diameter) of approximately 3 μm. In some embodiments, the structures of the walls and chambers in system 600 may be designed to capture dust particles that span approximately 0.3 μm to 7.0 μm, 0.5 μm to 5.0 μm, 1.0 μm to 4.0 μm, or 2.5 μm to 3.5 μm.

Referring to FIG. 6A, in some embodiments, dust particles 642 were allowed to flow past system 600 in the simulation (e.g., dust particles flowing over surface 610). The purpose was to simulate conditions in plasma chamber 502 (FIG. 5). While some not all dust particles 642 are caught in system 600, it is to be appreciated that recirculation of gas may allow continuous or iterative attempts at capturing dust particles 642.

Referring to FIG. 6B, in some embodiments, dust particles 642 were blocked from going over surface 610. The purpose of this simulation was to observe the flow and trapping behavior when the gas flow was increased inside system 600. The gas and dust particles 642 can flow through the maze-like structure (around extensions 614*a* and 614*b* and dividing wall 622). The maze-like structure can guide dust particle flow 640 such that dust particles 642 become trapped in the entrapment areas, which are chambers 618 and 620. It is shown that chamber 620 performs as expected by capturing a dense portion of dust particle flow 640. Some remaining dust particles were captured downstream at chamber 618. The comparison between FIGS. 6A and 6B shows that it is possible to increase the rate of dust capture by increasing the gas flow.

Figure 7:
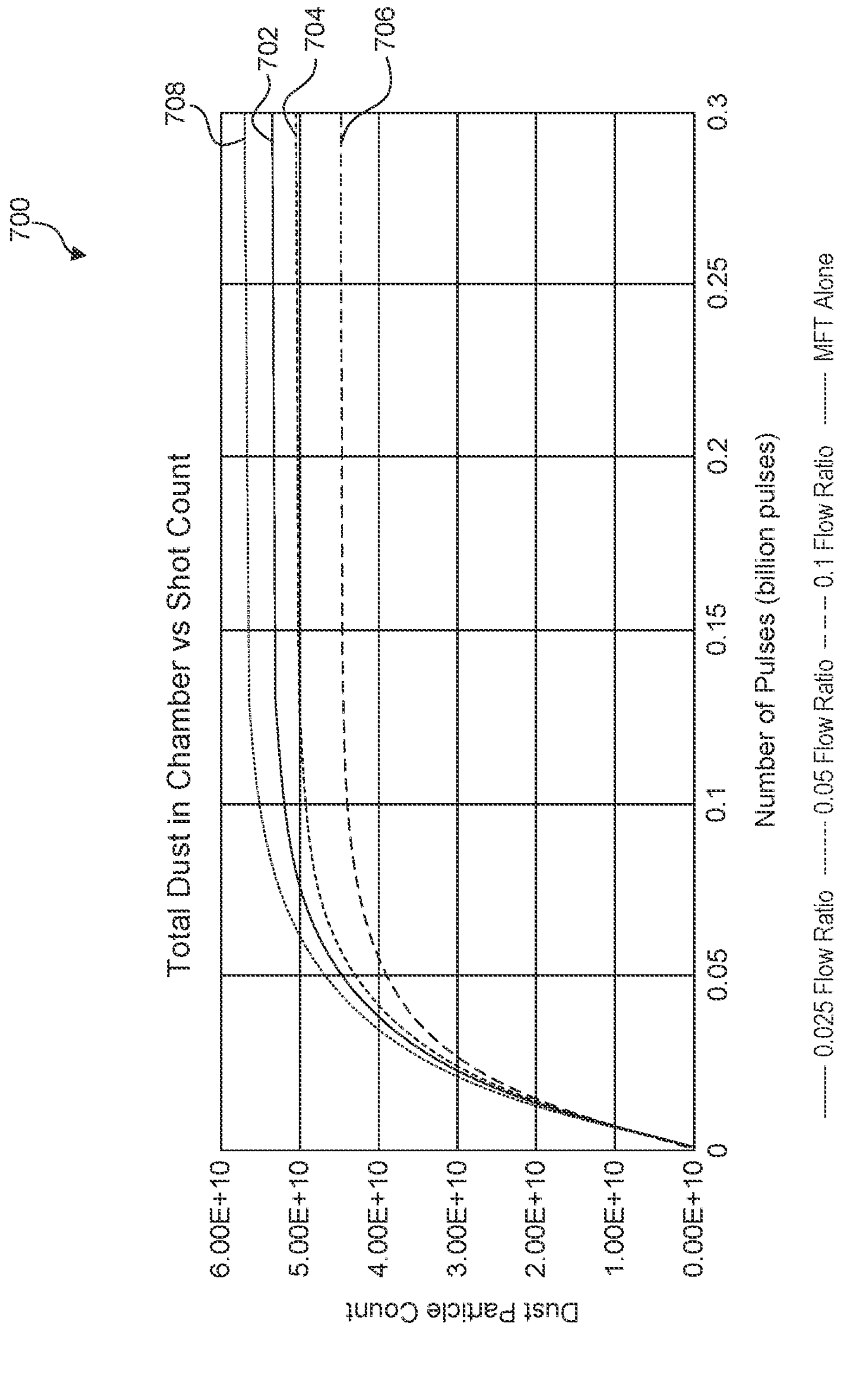
FIG. 7 shows a plot of predicted dust count in a plasma chamber, according to some embodiments.

FIG. 7 shows a plot 700 of predicted dust count in plasma chamber 502 (FIG. 5), according to some embodiments. In some embodiments, a benchmark for the lifespan of plasma chamber 502 (FIG. 5) can be measured in the number of pulses generated throughout its operable lifespan. Therefore, the horizontal axis represents a number of pulses generated in plasma chamber 502 (FIG. 5). The vertical axis represents dust count. Lower dust count is better.

In some embodiments, four different simulations may be performed based on slightly different setups involving passive dust traps. For example, plot 708 represents a "worst" baseline performance in which dust filtration is performed using only an external metal-fluoride trap (i.e., MFT alone) and no passive dust traps. Over the many pulses generated in the chamber, the MFT alone settles at the highest count of the four simulations. Plots 702, 704, and 706 represent the amount of dust in the chamber according to three different flow ratios (2.5%, 5%, and 10%, respectively). To clarify, a 100% flow ratio represents 100% of the gas flowing through the passive dust trap (e.g., system 300 (FIG. 3A), system 300B (FIG. 3B), or system 400 (FIG. 4)), whereas a 10% flow ratio represents 10% of the gas flowing through the passive dust trap while the remaining 90% flows outside (e.g., above surface 610 (FIG. 6A)). Compared to the amount of dust calculated for the MFT-only setup, these estimates reduce both the amount of dust in the chamber at any given moment. In other words, to achieve the performance of the passive dust trap using the respective flow rates, the MFT would have to remove an additional 5.93%, 11.45%, and 21.45% of dust particles, respectively. This would directly lead to an increase in chamber lifetime, as the MFT may remain at peak efficiency for longer amounts of time according to the reduced workload corresponding to the above-noted percentages.

Other embodiments 800A, 800B of the dust collector 300 are shown in FIGS. 8A and 8B, respectively. Either or both of the dust collectors 800A, 800B can be positioned within the gas discharge chamber 352 of a part of the illumination system 350 of FIG. 3A.

With reference to FIG. 8A, the dust collector 800A includes: a collector body 880A defining an inlet port 881A fluidly communicating with a cavity defined by the gas discharge chamber 352 along an inflow direction 881*i*A, and an outlet port 882A fluidly communicating with the cavity of the gas discharge chamber 352 along an outflow direction 882*o*A such that a flow path is defined from the inlet port 881A to the outlet port 882A. Unlike the dust collector 300, the outflow direction 882*o*A is distinct from (and perpendicular or transverse to) the inflow direction 881*i*A. The collector body 880A defines a dust collection chamber (which can be referred to as a "collection pocket") 878A in fluid communication with the inlet port 881A and the outlet port 882A. The collector body 880A includes an extension (such as a baffle) 874A between the inlet port 881A and the outlet port 882A and extending across (or transversely to) at least one of the inflow direction 881*i*A and the outflow direction 882*o*A. In some implementations, the baffle 874A is configured to extend toward the collection pocket 878A. The baffle 874A and the collector body 880A are configured to direct dust particles (such as dust particles 370 of FIG. 3A) from the inlet port 881A into the collection pocket 878A, where they can remain trapped and prevented from re-entering the cavity of the gas discharge chamber 352. In this implementation, the baffle 874A extends transversely to the inflow direction 881*i*A but is aligned with (and parallel with) the outflow direction 882*o*A. The direction along which the baffle 874A extends and the outflow direction 882*o*A aligns with or is parallel with the plane 830A, and the inflow direction 881*i*A aligns with or is parallel with the plane 828A. The collector body 880A includes a first section body 892A and a second section body 896A, the first section body 892A including the baffle 874A, and the inlet port 881A and the outlet port 882A each being defined between the first section body 892A and the second section body 896A.

With reference to FIG. 8B, the dust collector 800B includes: a collector body 880B defining an inlet port 881B fluidly communicating with a cavity defined by the gas discharge chamber 352 along an inflow direction 881*i*B, and an outlet port 882B fluidly communicating with the cavity of the gas discharge chamber 352 along an outflow direction 882*o*B such that a flow path is defined from the inlet port 881B to the outlet port 882B. Unlike the dust collector 300, the outflow direction 882*o*B is distinct from (and perpendicular or transverse to) the inflow direction 881*i*B. The collector body 880B defines a dust collection chamber (which can be referred to as a "collection pocket") 878B in fluid communication with the inlet port 881B and the outlet port 882B. The collector body 880B includes an extension (such as a baffle) 874B between the inlet port 881B and the outlet port 882B and extending across (or transversely to) at least one of the inflow direction 881*i*B and the outflow direction 882*o*B.

In some implementations (as shown in FIG. 8B), the baffle 874B is configured to extend toward the collection pocket 878B. The baffle 874B and the collector body 880B are configured to direct dust particles (such as dust particles 370 of FIG. 3A) from the inlet port 881B into the collection pocket 878B, where they remain trapped and prevented from re-entering the cavity of the gas discharge chamber 352. In this implementation, the baffle 874B extends transversely to the outflow direction 882*o*B but is aligned with the inflow direction 881*i*B. The direction along which the baffle 874B extends and the inflow direction 881*i*B aligns with or is parallel with the plane 830B and the outflow direction 882*o*B aligns with or is parallel with the plane 828B. The collector body 880B includes a first section body 892B and a second section body 896B, the first section body 892B including the baffle 874B, and the inlet port 881B and the outlet port 882B each being defined between the first section body 892B and the second section body 896B.

It is to be appreciated that other implementations of pulsed-discharge radiation sources are envisaged, for example, in medical procedures, machining via laser ablation, laser imprinting, or the like. Furthermore, the dust collection embodiments disclosed herein are not limited to implementations in lithography or gas laser chambers, but may be implemented in any apparatus that exhibits a gas flow with dust generation. In such apparatuses, the passive dust trap may be disposed in the path of the gas flow.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as specific examples of the more general terms "substrate" or "target portion", respectively. The substrate referred to herein can be processed, before or after exposure, in for example a track unit (a tool that typically applies a layer of resist to a substrate and develops the exposed resist) and/or a metrology unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam of radiation" and the like as used herein can encompass all types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as matter beams, such as ion beams or electron beams. The terms "light," "illumination," or the like can refer to non-matter radiation (e.g., photons, UV, X-ray, or the like). Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

Other aspects of the invention are set out in the following numbered clauses:

1. A system, comprising:
   - a first section comprising an elongated plate having a squared edge, an opposed tapered edge, a first surface, an opposed second surface, and first and second extensions extending from the opposed second surface;
   - a second section comprising first and second chambers with a dividing wall between the first and second chambers, the first chamber comprising a planar surface on an exterior side of the first chamber and disposed facing the opposed second surface, and the second chamber comprising a sloped surface on an exterior side of the second chamber and disposed facing the tapered edge; and first and second end plates that secure the first section above the second section such that the dividing wall is interposed between the first and second extensions.

2. The system of clause 1, wherein the first and second chambers each comprises a partially enclosed region.

3. The system of clause 1, wherein:
the first chamber has a first cross-sectional area,
the second chamber has a second cross-sectional area, and
the first cross-sectional area is larger than the second cross-sectional area.

4. The system of clause 1, wherein:
the dividing wall interposed between the first and second extensions defines a maze-like structure;
the maze-like structure is configured to guide a gas flow through the system; and
the first and second chambers are entrapment areas configured to capture particles from the gas flow.

5. The system of clause 1, wherein the tapered edge forms an angle in a range of 5° to 25° with respect to the opposed second surface.

6. The system of clause 1, wherein the sloped surface forms an angle in a range of 7° to 35° with respect to the opposed second surface.

7. The system of clause 1, wherein:
the dividing wall does not touch the first section, and
the first and second extensions do not touch the second section.

8. The system of clause 1, wherein each of the first section, the second section, and the first and second end plates comprises a metal plated with a non-reactive material.

9. The system of clause 8, wherein the metal comprises aluminum.

10. The system of clause 8, wherein the non-reactive material comprises nickel.

11. The system of clause 1, wherein the first chamber and the second chamber are each configured to trap particles within a range of about 0.5 μm to 7 μm in width or diameter.

12. The system of clause 1, wherein the tapered edge and the sloped surface form a funnel therebetween.

13. The system of clause 1, wherein the opposed second surface and the planar surface are spaced apart by a distance in a range of 10 mm to 60 mm.

14. The system of clause 1, wherein the system is configured to receive particles between the tapered edge and the sloped surface.

15. The system of clause 14, wherein the system is positioned such that at least a portion of the particles is captured at the second chamber.

16. A lithographic apparatus, comprising:
an illumination system configured to generate a radiation beam, the illumination system comprising:
a plasma chamber;
electrodes configured to ignite a plasma;
a flow system configured to generate a circulating gas flow through a flow path within the plasma chamber and configured to remove particles; and
a collection system disposed along the flow path and configured to collect the particles, the collection system comprising:
a first section comprising an elongated plate having a squared edge, an opposed tapered edge, a first surface, a opposed second surface, and first and second extensions extending from the opposed second surface;
a second section comprising first and second chambers with a dividing wall between the first and second chambers, the first chamber comprising a planar surface on an exterior side of the first chamber and disposed facing the opposed second surface, and the second chamber comprising a sloped surface on an exterior side of the second chamber and disposed facing the tapered edge; and first and second end plates that secure the first section above the second section such that the dividing wall is interposed between the first and second extensions.

17. The lithographic apparatus of clause 16, wherein the collection system is configured to receive the particles between the tapered edge and the sloped surface.

18. The lithographic apparatus of clause 16, wherein the collection system is positioned such that at least a portion of the particles is captured at the second chamber.

19. The lithographic apparatus of clause 16, wherein:
the dividing wall interposed between the first and second extensions defines a maze-like structure;
the maze-like structure is configured to guide the gas flow through the system; and
the first and second chambers are entrapment areas configured to capture the particles from the gas flow.

20. The lithographic apparatus of clause 16, wherein the tapered edge and the sloped surface form a funnel therebetween.

21. The lithographic apparatus of clause 16, wherein the collection system comprises a length approximately equal to a length of the plasma chamber.

22. The lithographic apparatus of clause 16, wherein the illumination system is a DUV light source.

23. The lithographic apparatus of clause 16, wherein:
the tapered edge forms an angle in a range of 5° to 25° with respect to the opposed second surface, and
the sloped surface forms an angle in a range of 7° to 35° with respect to the opposed second surface; and
the tapered edge and the sloped surface form a tapered inlet of the collection system, the tapered inlet being wider at an exterior of the collection system than an interior of the collection system.

24. The lithographic apparatus of clause 16, wherein:
the first chamber has a first cross-sectional area,
the second chamber has a second cross-sectional area, and
the first cross-sectional area is larger than the second cross-sectional area.

25. A passive particle collection device, comprising:
a first section comprising an elongated plate having a squared edge, an opposed tapered edge, a first surface, a opposed second surface, and first and second extensions extending from the opposed second surface;
a second section comprising first and second chambers with a dividing wall between the first and second chambers, the first chamber comprising a planar surface on an exterior side of the first chamber and disposed facing the opposed second surface, and the second chamber comprising a sloped surface on an exterior side of the second chamber and disposed facing the tapered edge; and first and second end plates that secure the first section above the second section such that the dividing wall is interposed between the first and second extensions,
wherein the opposed second surface and the planar surface are spaced apart by a distance in a range of 10 mm to 60 mm, wherein the first chamber has a first cross-sectional area, wherein the second chamber has a second cross-sectional area, wherein the first cross-sectional area is larger than the second cross-sectional area, and wherein the tapered edge forms an angle in a range of 5° to 25° with respect to the opposed second surface, wherein the sloped surface forms an angle in a range of 7° to 35° with respect to the opposed second surface, wherein the tapered edge and the sloped surface form a tapered inlet of the passive particle collection device, the tapered inlet being wider at an exterior of the passive particle collection device than at an interior of the passive particle collection device, wherein the passive particle collection device is configured to receive particles via the tapered inlet, wherein the passive particle collection device is positioned such that at least a portion of the particles is captured at the second chamber, wherein the dividing wall interposed between the first and second extensions defines a maze-like structure, wherein the maze-like structure is configured to guide a gas flow through the passive particle collection device, and wherein the first and second chambers are entrapment areas configured to capture the particles from the gas flow.

26. A dust collector for a gas discharge chamber of a light source, the dust collector comprising: a collector body defining an inlet port fluidly communicating with a cavity of the gas discharge chamber along an inflow direction, an outlet port fluidly communicating with the cavity of the gas discharge chamber along an outflow direction such that a flow path is defined from the inlet port to the outlet port, and a collection pocket in fluid communication with the inlet port and the outlet port; wherein the collector body includes a baffle between the inlet port and the outlet port and extending transverse to at least one of the inflow direction and the outflow direction.

27. The dust collector of clause 26, wherein the baffle extends toward the collection pocket.

28. The dust collector of clause 26, wherein the baffle and the collector body are configured to direct dust particles from the inlet port into the collection pocket.

29. The dust collector of clause 26, wherein the baffle extends perpendicularly to the at least one of the inflow direction and the outflow direction.

30. The dust collector of clause 26, wherein the collector body comprises a first section body and a second section body, the first section body including the baffle, and the inlet port and the outlet port each being defined between the first section body and the second section body.

31. The dust collector of clause 26, wherein the collector body defines only a single collection pocket.

32. The dust collector of clause 26, wherein:

the collector body comprises a plurality of baffles between the inlet port and the outlet port, each baffle extending transverse to at least one of the inflow direction and the outflow direction; and the collector body defines a plurality of collection pockets, with each collection pocket being associated with a baffle.

33. The dust collector of clause 26, wherein the collector body including the baffle is made of a nickel-plated metal, a bare metal, copper, brass, an alloy of nickel and copper, an alloy of copper, or Monel.

34. The dust collector of clause 26, wherein the dust collector has no moving parts or electronics.

35. An illumination system configured to condition a radiation beam, the illumination system comprising:

a gas discharge chamber configured to confine a gas;

electrodes inside the gas discharge chamber;

a flow system configured to generate a flow of the gas within the gas discharge chamber along a flow path; and a passive dust collector disposed along the flow path, the dust collector comprising:

a collector body defining an inlet port fluidly communicating with a cavity of the gas discharge chamber along an inflow direction, an outlet port fluidly communicating with the cavity of the gas discharge chamber along an outflow direction such that a flow path is defined from the inlet port to the outlet port, and a collection pocket in fluid communication with the inlet port and the outlet port;

wherein the collector body includes a baffle between the inlet port and the outlet port and extending transverse to at least one of the inflow direction and the outflow direction.

36. The illumination system of clause 35, wherein the gas includes fluorine, neon, krypton, or argon.

37. The illumination system of clause 35, wherein the flow system comprises an exhaust fan configured to direct dust and gas along the flow path.

The above described implementations and other implementations are within the scope of the following claims.

The invention claimed is:

1. A system comprising:

a first section comprising an elongated plate having a squared edge, an opposed tapered edge, a first surface, an opposed second surface, and first and second extensions extending from the opposed second surface;

a second section comprising first and second chambers with a dividing wall between the first and second chambers, the first chamber comprising a planar surface on an exterior side of the first chamber and disposed facing the opposed second surface, and the second chamber comprising a sloped surface on an exterior side of the second chamber and disposed facing the tapered edge; and first and second end plates that secure the first section above the second section such that the dividing wall is interposed between the first and second extensions.

2. The system of claim 1, wherein:

the first chamber has a first cross-sectional area, the second chamber has a second cross-sectional area, and the first cross-sectional area is larger than the second cross-sectional area.

3. The system of claim 1, wherein:

the dividing wall interposed between the first and second extensions defines a maze-like structure;

the maze-like structure is configured to guide a gas flow through the system; and the first and second chambers are entrapment areas configured to capture particles from the gas flow.

4. The system of claim 1, wherein the tapered edge forms an angle in a range of 5° to 25° with respect to the opposed second surface.

5. The system of claim 1, wherein the sloped surface forms an angle in a range of 7° to 35° with respect to the opposed second surface.

6. The system of claim 1, wherein:

the dividing wall does not touch the first section, and the first and second extensions do not touch the second section.

7. The system of claim 1, wherein each of the first section, the second section, and the first and second end plates comprises a metal plated with a non-reactive material.

8. The system of claim 1, wherein the first chamber and the second chamber are each configured to trap particles within a range of about 0.5 μm to 7 μm in width or diameter.

9. The system of claim 1, wherein the tapered edge and the sloped surface form a funnel therebetween.

10. The system of claim 1, wherein the opposed second surface and the planar surface are spaced apart by a distance in a range of 10 mm to 60 mm.

11. The system of claim 1, wherein the system is configured to receive particles between the tapered edge and the sloped surface.

12. A lithographic apparatus comprising:

an illumination system configured to generate a radiation beam, the illumination system comprising:

a plasma chamber;

electrodes configured to ignite a plasma;

a flow system configured to generate a circulating gas flow through a flow path within the plasma chamber and configured to remove particles; and a collection system disposed along the flow path and configured to collect the particles, the collection system comprising:

a first section comprising an elongated plate having a squared edge, an opposed tapered edge, a first surface, a opposed second surface, and first and second extensions extending from the opposed second surface;

a second section comprising first and second chambers with a dividing wall between the first and second chambers, the first chamber comprising a planar surface on an exterior side of the first chamber and disposed facing the opposed second surface, and the second chamber comprising a sloped surface on an exterior side of the second chamber and disposed facing the tapered edge; and first and second end plates that secure the first section above the second section such that the dividing wall is interposed between the first and second extensions.

13. The lithographic apparatus of claim 12, wherein the collection system is configured to receive the particles between the tapered edge and the sloped surface.

14. The lithographic apparatus of claim 12, wherein:

the dividing wall interposed between the first and second extensions defines a maze-like structure;

the maze-like structure is configured to guide the gas flow through the system; and the first and second chambers are entrapment areas configured to capture the particles from the gas flow.

15. The lithographic apparatus of claim 12, wherein the tapered edge and the sloped surface form a funnel therebetween.

16. The lithographic apparatus of claim 12, wherein the collection system comprises a length approximately equal to a length of the plasma chamber.

17. The lithographic apparatus of claim 12, wherein the illumination system is a DUV light source.

18. The lithographic apparatus of claim 12, wherein:

the tapered edge forms an angle in a range of 5° to 25° with respect to the opposed second surface, and the sloped surface forms an angle in a range of 7° to 35° with respect to the opposed second surface; and the tapered edge and the sloped surface form a tapered inlet of the collection system, the tapered inlet being wider at an exterior of the collection system than an interior of the collection system.

19. The lithographic apparatus of claim 12, wherein:

the first chamber has a first cross-sectional area, the second chamber has a second cross-sectional area, and the first cross-sectional area is larger than the second cross-sectional area.

20. A passive particle collection device comprising:

a first section comprising an elongated plate having a squared edge, an opposed tapered edge, a first surface, an opposed second surface, and first and second extensions extending from the opposed second surface;

a second section comprising first and second chambers with a dividing wall between the first and second chambers, the first chamber comprising a planar surface on an exterior side of the first chamber and disposed facing the opposed second surface, and the second chamber comprising a sloped surface on an exterior side of the second chamber and disposed facing the tapered edge; and first and second end plates that secure the first section above the second section such that the dividing wall is interposed between the first and second extensions, wherein the opposed second surface and the planar surface are spaced apart by a distance in a range of 10 mm to 60 mm, wherein the first chamber has a first cross-sectional area, wherein the second chamber has a second cross-sectional area, wherein the first cross-sectional area is larger than the second cross-sectional area, and wherein the tapered edge forms an angle in a range of 5° to 25° with respect to the opposed second surface, wherein the sloped surface forms an angle in a range of 7° to 35° with respect to the opposed second surface, wherein the tapered edge and the sloped surface form a tapered inlet of the passive particle collection device, the tapered inlet being wider at an exterior of the passive particle collection device than at an interior of the passive particle collection device, wherein the passive particle collection device is configured to receive particles via the tapered inlet, wherein the passive particle collection device is positioned such that at least a portion of the particles is captured at the second chamber, wherein the dividing wall interposed between the first and second extensions defines a maze-like structure, wherein the maze-like structure is configured to guide a gas flow through the passive particle collection device, and wherein the first and second chambers are entrapment areas configured to capture the particles from the gas flow.

* * * * *